(12) United States Patent
Koido (10) Patent No.: US 10,519,538 B2
(45) Date of Patent: Dec. 31, 2019

(54) SPUTTERING TARGET COMPRISING AL—TE—CU—ZR ALLOY, AND METHOD FOR PRODUCING SAME

(71) Applicant: JX Nippon Mining & Metals Corporation, Tokyo (JP)

(72) Inventor: Yoshimasa Koido, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 375 days.

(21) Appl. No.: 15/129,464

(22) PCT Filed: Feb. 6, 2015

(86) PCT No.: PCT/JP2015/053326
§ 371 (c)(1),
(2) Date: Sep. 27, 2016

(87) PCT Pub. No.: WO2015/146311
PCT Pub. Date: Oct. 1, 2015

(65) Prior Publication Data
US 2017/0175252 A1 Jun. 22, 2017

(30) Foreign Application Priority Data
Mar. 28, 2014 (JP) .................. 2014-069142

(51) Int. Cl.
*C23C 14/34* (2006.01)
*H01J 37/34* (2006.01)
(Continued)

(52) U.S. Cl.
CPC .......... *C23C 14/3414* (2013.01); *B22D 7/005* (2013.01); *B22F 3/14* (2013.01); *B22F 9/04* (2013.01); *B22F 9/22* (2013.01); *C22C 1/02* (2013.01); *C22C 1/04* (2013.01); *C22C 28/00* (2013.01); *C23C 14/14* (2013.01); *H01J 37/3426* (2013.01); *B22F 2201/013* (2013.01); *B22F 2201/10* (2013.01); *B22F 2201/20* (2013.01); *B22F 2301/052* (2013.01); *B22F 2301/10* (2013.01); *B22F 2301/205* (2013.01);
(Continued)

(58) Field of Classification Search
CPC .................................................. H01J 37/3426
See application file for complete search history.

(56) References Cited

U.S. PATENT DOCUMENTS 8,430,978 B2 * 4/2013 Inoue ........................ C22C 5/00
148/403
8,846,141 B1 * 9/2014 Robinson ............ H01L 31/0322
427/189
(Continued)

FOREIGN PATENT DOCUMENTS

JP 2014-029026 A 2/2014

*Primary Examiner* — Jason Berman
(74) *Attorney, Agent, or Firm* — Howson & Howson LLP (57) ABSTRACT

An Al—Te—Cu—Zr alloy sputtering target, comprising 20 at % to 40 at % of Te, 5 at % to 20 at % of Cu, 5 at % to 15 at % of Zr and the remainder of Al, wherein a Te phase, a Cu phase and a CuTe phase are not present in a structure of the target. An object of the present invention is to provide an Al—Te—Cu—Zr alloy sputtering target capable of effectively reducing particle generation, nodule formation and the like upon sputtering and further capable of reducing oxygen contained in the target.

18 Claims, 2 Drawing Sheets

(51) Int. Cl.
*B22D 7/00* (2006.01)
*B22F 3/14* (2006.01)
*B22F 9/04* (2006.01)
*B22F 9/22* (2006.01)
*C22C 1/02* (2006.01)
*C22C 1/04* (2006.01)
*C22C 28/00* (2006.01)
*C23C 14/14* (2006.01)

(52) U.S. Cl.
CPC ..... *B22F 2304/058* (2013.01); *B22F 2304/10* (2013.01); *B22F 2998/10* (2013.01)

(56) References Cited

U.S. PATENT DOCUMENTS

| | | |
|---|---|---|
| 2009/0065354 A1 | 3/2009 | Kardokus et al. |
| 2011/0027597 A1 | 2/2011 | Ohba et al. |
| 2011/0140065 A1 | 6/2011 | Maesaka et al. |
| 2011/0155988 A1 | 6/2011 | Ohba et al. |
| 2012/0145987 A1 | 6/2012 | Sei et al. |
| 2014/0151624 A1 | 6/2014 | Ohba et al. |

\* cited by examiner

[Fig. 1]

Group: Ceramic
Sample: ajima-2
C1309-10-1-CuTeZr synthesis 450
Oct 23   21:36   2013
Irradiation Current   1.002e-07A
Scan OFF   Magnification 2000
Time (ms)   10.00

[Fig. 2]

Group: Ceramic
Sample: ajima-2
C1309-10-1-6-HM2P(CTZ)+A3
Nov 14   17:14   2013
Irradiation Current   1.006e-07A
Scan OFF   Magnification 2000
Time (ms)   5.00

[Fig. 3]

SPUTTERING TARGET COMPRISING AL—TE—CU—ZR ALLOY, AND METHOD FOR PRODUCING SAME

BACKGROUND

The present invention relates to a sputtering target comprising an Al—Te—Cu—Zr alloy and a method of manufacturing thereof. In particular, the present invention relates to an Al—Te—Cu—Zr alloy sputtering target for forming a thin film comprising an Al—Te—Cu—Zr alloy as a variable resistance material, and a method of manufacturing thereof.

As variable resistance recording materials, thin films comprising Te—Al based materials and Te—Zr based materials have been used in recent years for recording information by taking advantage of resistance change. Thin films comprising such materials are commonly formed by a so-called physical vapor deposition method such as the vacuum deposition method and the sputtering method. In particular, the magnetron sputtering method is often used in view of operativity and stable film formation.

A method of forming a thin film by the sputtering method involves physically bombarding positive ions such as argon ions to a target placed at an cathode to eject a material of the target by means of the collision energy, thereby depositing a film having the substantially same composition as the material of the target on a facing substrate at the cathode side. Deposition by the sputtering method is characterized by that films having thicknesses ranging from as thin as angstroms to as thick as tens of micrometers can be formed at a stable deposition rate by adjusting processing time, input power and the like.

A particular problem in forming an alloy film such as a Te—Al based alloy as a variable resistance recording material is nodule formation on the surface of a target during sputtering, which may be responsible for particles and arcing. Since an Al—Te—Cu—Zr alloy target is configured from various metal components having different deposition rates, there is a problem in more frequent formation of nodules and a large amount of particle generation. The target and sputtering problem as described above accounts in no small part for decrease in the quality of a thin film as a recording medium.

As a conventional Te—Al based sputtering target, Patent Document 1, for example, discloses a target comprising one or more high-melting-point metal elements selected from the element group of Ti, Zr, Hf, V, Nb, Ta, and lanthanoid elements; one or more elements selected from Al, Ge, Zn, Co, Cu, Ni, Fe, Si, Mg and Ga; and one or more chalcogen elements selected from S, Se and Te. A method of manufacturing the above target is also disclosed, the method comprising: producing an AlCuZr alloy ingot; then pulverizing the alloy ingot to prepare an alloy powder; mixing the alloy powder with a Te powder and a Ge powder; and sintering the resulting mixture to manufacture an AlCuGeTeZr target material (see Example 1).

Unfortunately, alloying of Al and Te for production of a sintered compact comprising a Te—Al based alloy may generate Al—Te which is highly reactive and requires complicated handling. In addition, the large vapor pressure of Te may result in a composition deviation when synthesized with a high-melting-point material such as Zr (the vapor pressure at 1000° C. is 100 kPa for Te and 1 kPa or less for Zr). Further, significantly different sputtering rates of constituent phases may disadvantageously result in heterogeneous deposition rates and nodule formation on the surface of a sputtering target, which may, in turn, be responsible for particle generation.

CITATION LIST

Patent Document

Patent Document 1: JP 2011-026679 A

SUMMARY

An object of the present invention is to provide a solution to the above problems, in particular to provide an Al—Te—Cu—Zr alloy sputtering target capable of effectively reducing particle generation, nodule formation and the like upon sputtering and further capable of reducing oxygen contained in the target. Another object of the present invention is to provide a method of manufacturing the above sputtering target.

Solution to Problem

After conducting extensive studies to solve the aforementioned problems, the present inventors find that generation of particles and nodules can be reduced for improving a deposition yield by: reducing difference in sputtering rates of constituent phases on a sputtering target to obtain uniform deposition rates; finely pulverizing crystal grains; and reducing the content of oxygen.

In view of the above findings, the present invention provides the followings.
1) An Al—Te—Cu—Zr alloy sputtering target, comprising 20 at % to 40 at % of Te, 5 at % to 20 at % of Cu, 5 at % to 15 at % of Zr and the remainder of Al, wherein a Te phase, a Cu phase and a CuTe phase are not present in a structure of the target.
2) The Al—Te—Cu—Zr alloy sputtering target according to 1), wherein an Al phase, a CuAl phase, a TeZr phase and a Zr phase are present in the structure of the target.
3) The Al—Te—Cu—Zr alloy sputtering target according to 1) or 2), having a mean grain size of 10 μm or less.
4) The Al—Te—Cu—Zr alloy sputtering target according to any one of 1) to 3), having a purity of 3N or more and an oxygen content of 3000 wt. ppm or less.
5) The Al—Te—Cu—Zr alloy sputtering target according to any one of 1) to 4), comprising one or more elements selected from Si, C, Ti, Hf, V, Nb, Ta, lanthanoid elements, Ge, Zn, Co, Ni, Fe, Mg, Ga, S and Se.
6) The Al—Te—Cu—Zr alloy sputtering target according to any one of 1) to 5), having a relative density of 90% or more.

The present invention further provides the followings.
7) A method of manufacturing an Al—Te—Cu—Zr alloy sputtering target, the method comprising the steps of: dissolving a Cu raw material and a Te raw material to produce a CuTe alloy ingot; pulverizing the CuTe alloy ingot; then hot-pressing the pulverized CuTe powder and a Zr raw material powder to produce a CuTeZr alloy; then pulverizing the CuTeZr alloy; and hot-pressing the pulverized CuTeZr and an Al raw material powder to produce a CuTeZrAl alloy.
8) The method of manufacturing an Al—Te—Cu—Zr alloy sputtering target according to 7), wherein the pulverized CuTe powder and the Zr raw material powder are hot-pressed at a temperature of 300° C. to 400° C. to produce the CuTeZr alloy.
9) The method of manufacturing an Al—Te—Cu—Zr alloy sputtering target according to 7), wherein the pulverized CuTe powder and the Zr raw material powder are hot-pressed at a temperature of 400° C. to 600° C. to produce the CuTeZr alloy.

10) The method of manufacturing an Al—Te—Cu—Zr alloy sputtering target according to any one of 7) to 9), wherein during the step of pulverizing the CuTeZr alloy, the alloy is pulverized under an inert atmosphere or under vacuum.

11) A method of manufacturing an Al—Te—Cu—Zr alloy sputtering target, the method comprising the steps of: dissolving a Cu raw material and a Te raw material to produce a CuTe alloy ingot; pulverizing the CuTe alloy ingot; then hot-pressing the pulverized CuTe powder, a Zr raw material powder and an Al raw material powder to produce the CuTeZrAl alloy.

12) The method of manufacturing an Al—Te—Cu—Zr alloy sputtering target according to 11), wherein the pulverized CuTe powder, the Zr raw material powder and the Al raw material powder are hot-pressed at a temperature of 300° C. to 600° C. to produce the CuTeZrAl alloy.

13) The method of manufacturing an Al—Te—Cu—Zr alloy sputtering target according to any one of 6) to 12), wherein the pulverized CuTe powder has a mean grain size of 1 to 10 μm, the Zr raw material powder has a mean grain size of 1 to 10 μm, and the Al raw material powder has a mean grain size of 1 to 10 μm.

14) The method of manufacturing an Al—Te—Cu—Zr alloy sputtering target according to any one of 6) to 13), wherein the pulverized CuTe powder is subjected to hydrogen reduction.

15) The method of manufacturing an Al—Te—Cu—Zr alloy sputtering target according to any one of 6) to 14), wherein during the step of pulverizing the CuTe alloy, the alloy is pulverized under an inert atmosphere or under vacuum.

The sputtering target of Al—Te—Cu—Zr alloy sintered compact according to the present invention can achieve uniformity in deposition rate by virtue of alloying Te and Cu, which have large sputtering rates, with Al and Zr, which have small sputtering rates. The sputtering target of Al—Te—Cu—Zr alloy sintered compact according to the present invention also has finely pulverized crystal grains and a reduced oxygen content. Therefore, the present invention can show an advantageous effect in that the development of particles and nodules due to these can be reduced.

DETAILED DESCRIPTION

The Al—Te—Cu—Zr alloy sputtering target according to the present invention comprises 20 at % to 40 at % of Te, 5 at % to 20 at % of Cu, 5 at % to 15 at % of Zr and the remainder of Al. Their composition ranges are each selected so as to obtain the characteristics of a variable resistance recording material. The alloy target according to the present invention contains Al, Te, Cu and Zr as main components, and may also contain other components in order to improve various properties as a recording material.

Figure 3:
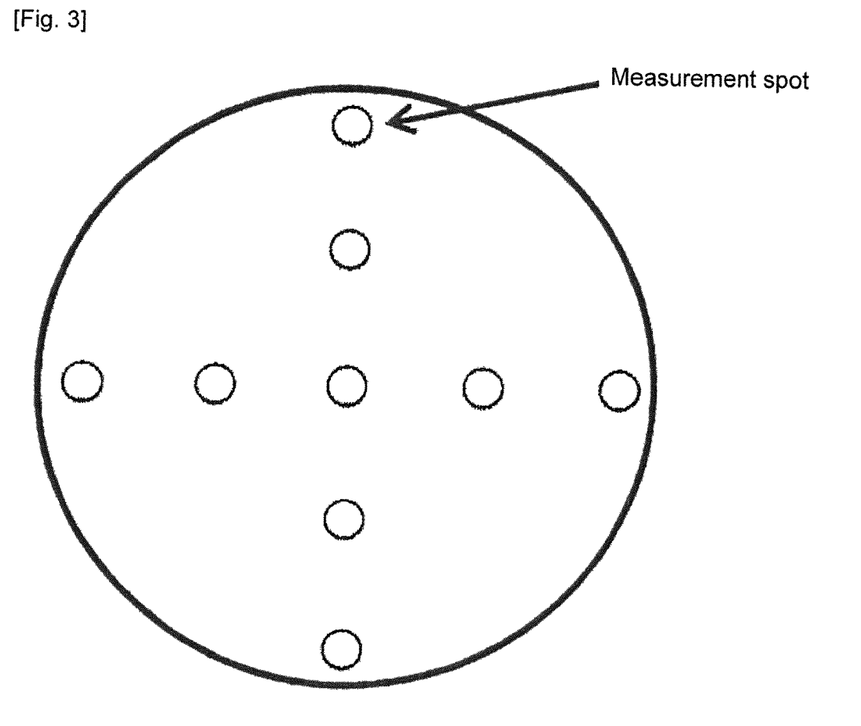
FIG. 3 is a schematic view showing FE-EPMA observation spots in a sputtering target.

The Al—Te—Cu—Zr alloy sputtering target according to the present invention is characterized by that a Te phase, a Cu phase and a CuTe phase are not present in the structure thereof. The Te, Cu and CuTe phases may readily be sputtered, resulting in accelerated deposition rates. The absence of these phases thus enables uniform deposition rates throughout the entire target. Further, the absence of the very reactive CuTe phase as described above enables easy handling. The phrase "a Te phase, a Cu phase and a CuTe phase are not present" as used herein means that the area percentage of each phase is less than 5% as observed in a 2000× field of an EPMA mapping image. Considering the possibility of segregation, EPMA observations are also performed at multiple positions as shown in FIG. 3. At least half or more of them are required to show an area percentage of less than 5% for each phase.

The sputtering target according to the present invention preferably has an Al phase, a CuAl phase, a TeZr phase and a Zr phase present in the structure thereof. Such reduced difference in sputtering rates between the constituent phases of a target can allow more uniform deposition rates, thereby significantly reducing the development of particles and nodules. Note that the presence of them can be determined by observing the structure by EPMA.

The sputtering target according to the present invention preferably has a mean grain size of 10 μm or less. For a composite material comprising those phases with different deposition rates, a decreased crystal grain size can reduce the unevenness on the surface of a sputtering target, and thus can reduce the development of nodules. Note that the crystal grain size of a sputtering target can significantly be varied depending on adjustment of the grain size of raw powders as well as conditions for pulverizing an alloy ingot, conditions for hot-pressing and the like as described below.

Further, the sputtering target according to the present invention preferably has an oxygen content of 3000 wt. ppm or less. Reduction in the oxygen content can suppress particle generation due to oxygen, further improving the properties of a device such as a variable resistance memory. Moreover, the sputtering target more preferably has a purity of 3N (99.9%) or more because the presence of impurity elements may deteriorate device properties.

The sputtering target according to the present invention contains Al, Te, Cu and Zr as main components, and may also contain other components in order to module the properties of a device such as a variable resistance memory. For example, one or more elements selected from Si, C, Ti, Hf, V, Nb, Ta, lanthanoid elements, Ge, Zn, Co, Ni, Fe, Mg, Ga, S and Se may be added. These additives can improve device performance when they are added preferably in a range of 0.1 wt % to 5.0 wt %.

The sputtering target according to the present invention preferably has a relative density of 90% or more. Use of such a high-density target can provide good sputtering. The relative density as used in the present invention will be calculated by the following formula.

Relative density={(Density of sintered compact)/(Theoretical density)}×100 wherein the density of a sintered compact is derived from the volume and measured weight thereof, the volume being obtained by measuring the dimensions of the sintered compact with calipers, and the theoretical density is calculated, as described below, by multiplying the individual density of each raw material with its mixing mass ratio, and summing the resulting values.

Theoretical density=Σ{(Theoretical density of each raw material×mixing ratio)+(Theoretical density of each raw material×mixing ratio)+ . . . }

The Al—Te—Cu—Zr alloy sputtering target according to the present invention can be produced, for example, by the following method.
(Synthesis of CuTe)

First, a Cu raw material and a Te raw material are prepared. These materials are then weighed out to obtain a desired composition ratio. Then, these raw materials are charged into a quartz ampule and vacuum-sealed. A synthesis process is then performed in an oscillating synthesis furnace. The dissolution temperature is preferably 1000 to 1300° C. so that Cu and Te are thoroughly dissolved. After dissolution, they are cooled in a furnace. The structure of the resulting sintered compact comprises a CuTe phase and a Te phase. Note that, although CuTeZr may be synthesized in one step, a stepwise synthesis is preferred in which CuTe is first prepared, and Zr is then added in order to synthesize CuTeZr. This is because a high vapor pressure of Te may result in a composition deviation.

Then, the synthesized CuTe sintered compact is pulverized. Pulverization can be performed with a common device such as a stamp mill, a ball mill, a vibration mill, a pin mill, a hammer mill and a jet mill. In order to effectively prevent oxidation of a pulverized powder, the process is preferably performed under vacuum or under an inert atmosphere. When the process can not be performed under vacuum or under an inert atmosphere, hydrogen reduction can subsequently be performed to reduce the content of oxygen. The CuTe powder pulverized in this way may be then screened with a sieve to achieve a grain size of 0.1 to 10 μm.
(Synthesis of CuTeZr)

The CuTe powder and a Zr powder are mixed in a desired composition ratio, and sintered by hot press for synthesis of CuTeZr. The sintering temperature may be 300 to 400° C. for solid phase synthesis, and 400 to 600° C. (provided that 400° C. is not included) for liquid phase synthesis. The grain size of the Zr powder is preferably 0.1 to 10 μm for promoting a reaction of Te with Zr. Then, the synthesized CuTeZr sintered compact is pulverized. Pulverization may be performed with a common device as described above. CuTeZr is preferably processed under vacuum or under an inert atmosphere to prevent oxidation of the pulverized powder because the oxygen content of CuTeZr can not be reduced effectively by hydrogen reduction. The structure of the sintered compact obtained in this way comprises a CuTe phase, a TeZr phase and a Zr phase. Then, the pulverized CuTeZr powder can be screened with a sieve to achieve 0.1 to 10 μm.

Synthesis of CuTeZrAl

The CuTeZr powder and an Al powder are mixed in a desired composition ratio, and sintered by hot press for synthesis of CuTeZrAl. The sintering temperature is preferably 300 to 600° C. for performing a synthesis reaction of CuTeZr with Al. The grain size of the Al powder is preferably 0.1 to 10 μm for promoting a reaction with CuTeZr. A sintered compact with a structure comprising an Al phase, a CuAl phase, a TeZr phase and a Zr phase can be obtained in a way as described above.

Alternatively, a CuTe powder, a Zr powder and an Al powder may be mixed in a desired composition ratio, and sintered by hot press at a temperature of 300 to 600° C. for synthesis of CuTeZrAl. Once CuTeZr is synthesized, oxygen can not be reduced by hydrogen reduction as described above. Therefore, synthesis of CuTeZr can be coupled with synthesis of CuTeZrAl to effectively suppress oxygen contamination as well as simplify the process. Even a sintered compact obtained in this way can show a structure comprising an Al phase, a CuAl phase, a TeZr phase and a Zr phase.
(Addition of Other Components)

The aforementioned additive elements for improving device performance are preferably added at the following steps. Ge, Ga, S, Se and Zn have low melting points to allow easy synthesis, and also have relatively low activity. Therefore they are preferably added when Cu and Te are dissolved. For C, Ti, Hf, V, Nb, Ta, lanthanoid elements and Mg, synthesis is difficult due to their high melting points, and deoxygenation is also difficult due to their high activity. Therefore they are preferably added when a Zr powder and an Al powder are mixed with a CuTe powder. Others such as Si, Co, Ni and Fe may appropriately be added at any of the above steps.

A CuTeZrAl sintered compact synthesized according to the above method or a sintered compact comprising other components as additives can be subjected to machining such as cutting and polishing, if desired, to produce a sputtering target with a predetermined shape. In the manner as described above, the Al—Te—Cu—Zr alloy sputtering target according to the present invention having the aforementioned features can be produced.

EXAMPLES

Below, embodiments of the present invention will be described with reference to Examples and Comparative Examples. Note that these Examples are presented merely for illustrative purposes. The present invention shall not be limited to these in any sense. That is, the present invention shall be limited only by the claims and encompass various modifications other than those described in Examples which fall within the scope of the present invention.

Example 1

A Cu raw material with a purity of 4N and a Te raw material with a purity of 5N were weighed out to give a composition of Cu:Te=30:70 (at %). A Cu wire rod and a Te shot sized for a synthesis ampule were selected as raw materials. Then, the raw materials were charged into a high-purity quartz ampule and vacuum-sealed to prevent oxidation and contamination from the environment during dissolution. An ampule with an inner diameter of 80 mm and a length of 200 mm was selected and used so as to obtain a homogeneous temperature distribution and a uniformly mixed molten metal. Then, dissolution was performed to obtain an alloy. The temperature was maintained at 1000° C. for 4 hours to ensure that Cu and Te are thoroughly reacted and dissolved. During this process, a molten metal was allowed to oscillate at a frequency of 30 Hz for homogenization. After dissolution was completed, the content was cooled slowly to room temperature in the furnace to produce a cast ingot. A highly pure CuTe ingot with a purity of 4N was obtained in a way as described above.

Subsequently, the ingot was pulverized with a stamp mill under ambient air. During pulverization with a stamp mill, a clean hammer and pot were used to prevent contamination from the parts of the mill. For efficient stamp-mill pulverization, the total charge per pot was set to 400 g, and pulverization was performed at a frequency of 60 Hz for 1 hour. Classification was then performed with a 90-μm sieve, and only a through-sieve fraction was collected. Note that the on-sieve fraction was charged into the next batch in the process, and the entire portion was subjected to the above treatments afterwards. The resulting powder was subjected to hydrogen reduction treatment for further reduction of oxygen. Hydrogen reduction was performed under conditions where the reduction temperature was 325° C., the holding time was 6 hours, and the hydrogen flow rate was 5 liters/minute. These conditions were selected in order to achieve sufficiently reduced oxygen and to prevent significantly proceeded necking. The oxygen content of the CuTe powder was able to be reduced to 80 wt. ppm from 680 wt. ppm.

Figure 1:
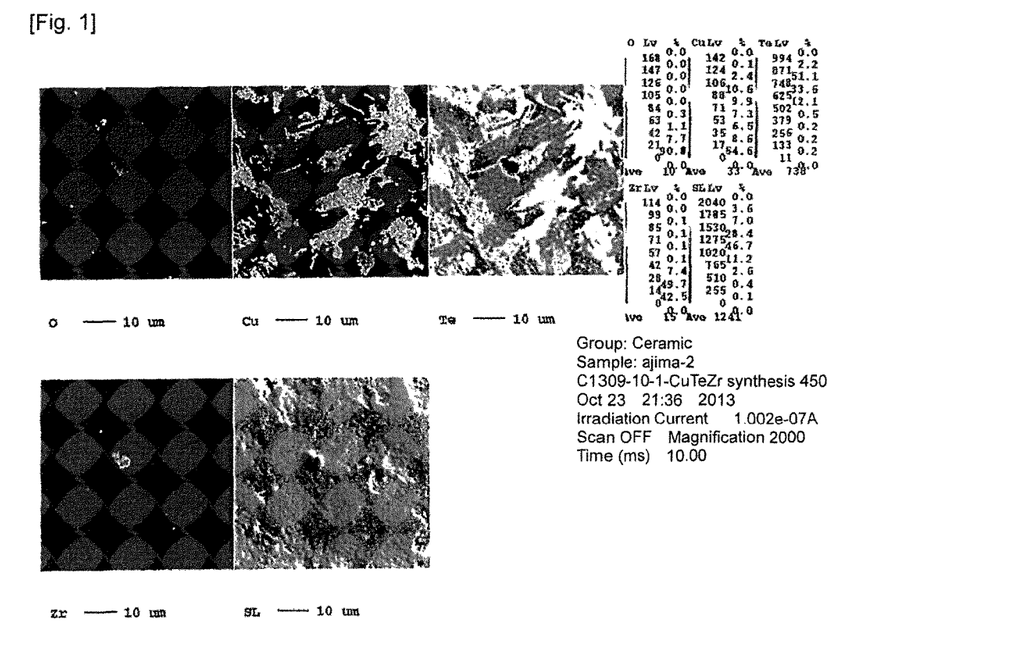
FIG. 1 shows element mappings obtained from FE-EPMA of a sintered compact according to Example 1.

Then, a CuTe powder with a maximum grain size of 90 µm and a Zr powder with a maximum grain size of 10 µm were weighed out to give a composition of CuTe:Zr=83.3:16.7 (at %). The resulting raw material powder was charged into a graphite die with a diameter of 480 mm, and hot-pressed to produce a sintered compact. Sintering conditions were such that the sintering temperature was 325° C. (solid phase reaction), the pressing pressure was 300 kgf/cm$^2$, and the holding time was 4 hours, and then sintering was further performed at a sintering temperature of 400° C. (solid phase reaction), a pressing pressure of 300 kgf/cm$^2$ and a holding time of 4 hours. Note that all sintering treatments were performed under vacuum atmosphere. EPMA mapping images of the resulting sintered compact are shown in FIG. 1. FIG. 1 demonstrates that the sintered compact had a structure comprising a TeZr phase and a Zr phase.

Figure 2:
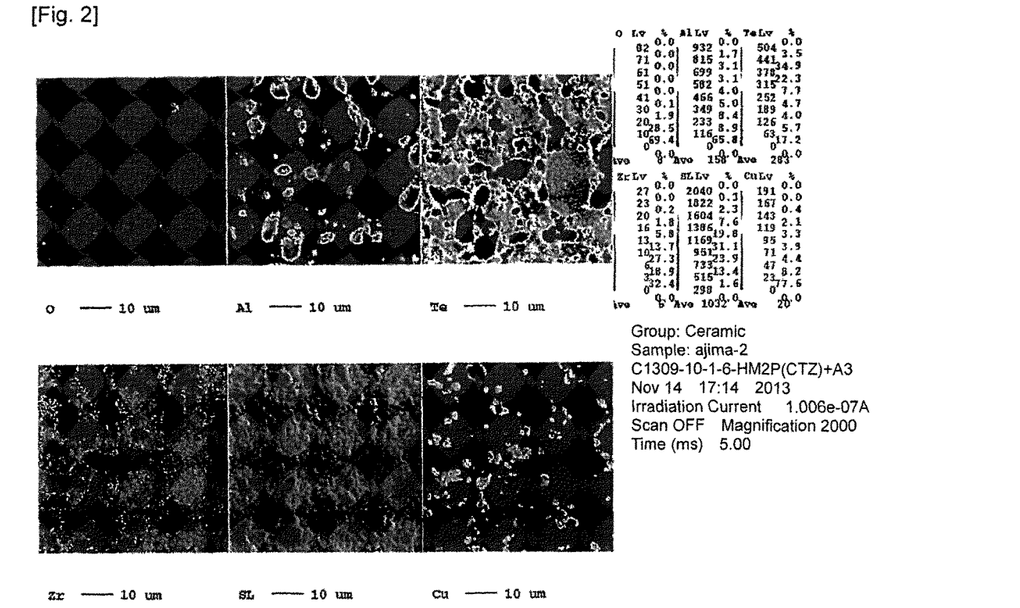
FIG. 2 shows element mappings obtained from FE-EPMA of a sintered compact according to Example 2.

Then, this sintered compact was pulverized with a stamp mill under an Ar atmosphere where oxygen is present at 10 ppm or less. The same pulverization conditions as in the pulverization of the CuTe ingot were used. Classification was then performed with a 90-µm sieve, and only a through-sieve fraction was collected. Note that the on-sieve fraction was charged into the next batch in the process, and the entire portion was subjected to the above treatments afterwards. The resulting CuTeZr powder with a maximum grain size of 90 µm and an atomized Al powder with a purity of 4N and a mean grain size of 3 µm were weighed out to give a composition of Al:Te:Cu:Zr=40:35:15:10 (at %). The resulting raw material powder was charged into a graphite die with a diameter of 480 mm, and hot-pressed to produce a sintered compact. Sintering conditions were a sintering temperature of 400° C., a pressing pressure of 300 kgf/cm$^2$, a holding time of 4 hours, and an argon atmosphere. EPMA mapping images of the resulting sintered compact are shown in FIG. 2. FIG. 2 demonstrates that the sintered compact had a structure comprising an Al phase, a CuAl phase, a TeZr phase and a Zr phase.

An Al—Te—Cu—Zr alloy sintered compact with a purity of 3N or more, an oxygen concentration of 3000 wt. ppm, a relative density of 90% and a mean grain size of 8 µm was obtained in a way as described above. Then, this sintered compact was machined to produce a sputtering target, with which sputtering was performed. Results showed that microarcing due to nodules and oxides was significantly reduced, and the rate of particle generation was very low with the number of particles (0.2 µm or more) being 20 or less.

Example 2

A sintered compact was produced under similar conditions as in Example 1 except that the temperature (maximum) when sintering a mixture of a CuTe powder and a Zr powder was changed to 500° C. (liquid phase reaction) from 400° C. An Al—Te—Cu—Zr alloy sintered compact with a purity of 3N or more, an oxygen concentration of 2900 wt. ppm, a relative density of 93% and a mean grain size of 9 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed under similar conditions as in Example 1. Results showed that the number of particles (0.2 µm or more) was as extremely low as 18.

Example 3

The CuTe powder with a grain size of 90 µm or less which was produced in Example 1 was further pulverized with a jet mill. The maximum grain size after pulverization was 5 µm, and the content of oxygen was 680 wt. ppm. Then, hydrogen reduction was performed under the same conditions as in Example 1 to obtain a low-oxygen powder with an oxygen concentration of 80 wt. ppm. The resulting CuTe powder with a maximum grain size of 5 µm and an oxygen concentration of 80 wt. ppm, an Al powder with a maximum grain size of 10 µm and an oxygen concentration of 5100 wt. ppm and a Zr powder with a maximum grain size of 10 µm and an oxygen concentration of 8000 wt. ppm were weighed out and mixed to give the same composition as in Example 1. The resulting raw material powder was charged into a graphite die with a diameter of 480 mm, and hot-pressed to produce a sintered compact. As in Example 1, the sintering conditions were such that the sintering temperature was 325° C., the pressing pressure was 300 kgf/cm$^2$, and the holding time was 4 hours, and then sintering was further performed at a sintering temperature of 400° C., a pressing pressure of 300 kgf/cm$^2$ and a holding time of 4 hours under argon atmosphere. An Al—Te—Cu—Zr alloy sintered compact with a purity of 3N or more, an oxygen concentration of 1900 wt. ppm, a relative density of 94% and a mean grain size of 7 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was as extremely low as 25.

Example 4

A sintered compact was produced under similar conditions as in Example 1 except that the composition ratio of Al, Te, Cu and Zr was changed as shown in Table 1. An Al—Te—Cu—Zr alloy sintered compact with a purity of 3N or more, an oxygen concentration of 2700 wt. ppm, a relative density of 90% and a mean grain size of 8 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was as extremely low as 20.

Example 5

A sintered compact was produced under similar conditions as in Example 2 except that the composition ratio of Al, Te, Cu and Zr was changed as shown in Table 1. An Al—Te—Cu—Zr alloy sintered compact with a purity of 3N or more, an oxygen concentration of 2400 wt. ppm, a relative density of 93% and a mean grain size of 9 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was as extremely low as 18.

Example 6

A sintered compact was produced under similar conditions as in Example 3 except that Ga as an additive element was added in dissolution of Cu and Te to give a composition shown in Table 1. An Al—Te—Cu—Zr alloy (containing Ga) sintered compact with a purity of 3N or more, an oxygen concentration of 2800 wt. ppm, a relative density of 92% and a mean grain size of 6 µm was obtained in a way as described above. Observation showed that the sintered compact had a structure comprising an Al phase, a CuAl phase, a CuGa phase, a TeZr phase and a Zr phase. Then, this sintered compact was machined to produce a sputtering target, with which sputtering was performed. Results showed that the number of particles (0.2 µm or more) was as extremely low as 39.

Example 7

A sintered compact was produced under similar conditions as in Example 3 except that S as an additive element was added in dissolution of Cu and Te to give a composition shown in Table 1. An Al—Te—Cu—Zr alloy (containing S) sintered compact with a purity of 3N or more, an oxygen concentration of 2800 wt. ppm, a relative density of 90% and a mean grain size of 6 µm was obtained in a way as described above. Observation showed that the sintered compact had a structure comprising an Al phase, a CuAl phase, a CuS phase, a TeZr phase and a Zr phase. Then, this sintered compact was machined to produce a sputtering target, with which sputtering was performed. Results showed that the number of particles (0.2 µm or more) was as extremely low as 21.

Example 8

A sintered compact was produced under similar conditions as in Example 3 except that a Ti powder as an additive element was added in sintering of a CuTe powder, a Zr powder and an Al powder to give a composition shown in Table 1. At this time, the Ti powder had a maximum grain size of 10 µm and an oxygen concentration of 7900 wt. ppm. An Al—Te—Cu—Zr alloy (containing Ti) sintered compact with a purity of 3N or more, an oxygen concentration of 2600 wt. ppm, a relative density of 95% and a mean grain size of 8 µm was obtained in a way as described above. Observation showed that the sintered compact had a structure comprising an Al phase, a CuAl phase, a TeZr phase, a Ti phase and a Zr phase. Then, this sintered compact was machined to produce a sputtering target, with which sputtering was performed. Results showed that the number of particles (0.2 µm or more) was as extremely low as 27.

Example 9

A sintered compact was produced under similar conditions as in Example 3 except that Ge as an addictive element was added in dissolution of Cu and Te to give a composition as shown in Table 1, and a C powder as an additive element was further added in sintering of a CuGeTe powder, a Zr powder and an Al powder to give a composition as shown in Table 1. At this time, the Ti powder had a maximum grain size of 2 µm and an oxygen concentration of 3100 wt. ppm. An Al—Te—Cu—Zr alloy (containing Ge and C) sintered compact with a purity of 3N or more, an oxygen concentration of 2700 wt. ppm, a relative density of 91% and a mean grain size of 9 µm was obtained in a way as described above. Observation showed that the sintered compact had a structure comprising an Al phase, a C phase, a CuAl phase, a GeTe phase, a TeZr phase and a Zr phase. Then, this sintered compact was machined to produce a sputtering target, with which sputtering was performed. Results showed that the number of particles (0.2 µm or more) was as extremely low as 16.

Example 10

A sintered compact was produced under similar conditions as in Example 3 except that Se as an addictive element was added in dissolution of Cu and Te to give a composition as shown in Table 1, and an Si powder as an additive element was further added in sintering of a CuGeTe powder, an Al powder and a Zr powder to give a composition as shown in Table 1. At this time, the Si powder had a maximum grain size of 2 µm and an oxygen concentration of 1600 wt. ppm. An Al—Te—Cu—Zr alloy (containing Se and Si) sintered compact with a purity of 3N or more, an oxygen concentration of 2900 wt. ppm, a relative density of 91% and a mean grain size of 7 µm was obtained in a way as described above. Observation showed that the sintered compact had a structure comprising an Al phase, a CuAl phase, an Si phase, an SeTeZr phase and a Zr phase. Then, this sintered compact was machined to produce a sputtering target, with which sputtering was performed. Results showed that the number of particles (0.2 µm or more) was as extremely low as 33.

Comparative Example 1

A Cu powder with a mean grain size of 40 µm and an oxygen concentration of 100 wt. ppm, a Te powder with a mean grain size of 30 µm and an oxygen concentration of 100 wt. ppm, a Zr powder with a mean grain size of 40 µm and an oxygen concentration of 8000 wt. ppm and an Al powder with a mean grain size of 40 µm and an oxygen concentration of 100 wt. ppm were weighed out and mixed to give the same composition as in Example 1. The resulting raw material powder was charged into a graphite die with a diameter of 480 mm, and hot-pressed to produce a sintered compact. Sintering conditions were such that the sintering temperature was 370° C., and the pressing pressure was 300 kgf/cm$^2$, and the holding time was 4 hours, and sintering was performed under an argon atmosphere. An Al—Te—Cu—Zr alloy sintered compact with a purity of 3N or more, an oxygen concentration of 2600 wt. ppm, a relative density of 95% and a mean grain size of 7 µm was obtained in a way as described above. Observation showed that the sintered compact had a structure comprising an Al phase, a Cu phase, a CuTe phase, a CuTeZr phase, a TeZr phase and Zr. Then, this sintered compact was machined to produce a sputtering target, with which sputtering was performed. Results showed that the number of particles (0.2 µm or more) was significantly increased as large as 468.

Comparative Example 2

A sintered compact was produced under similar conditions as in Example 1 except that the sintering temperature (maximum) when sintering a mixture of a CuTeZr powder and an Al powder was changed to 370° C. from 400° C. An Al—Te—Cu—Zr alloy sintered compact with a purity of 3N or more, an oxygen concentration of 3600 wt. ppm, a relative density of 83% and a mean grain size of 9 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was increased as large as 221.

Comparative Example 3

A CuTeZr sintered compact was allowed to stand for 30 minutes under the ambient air after pulverized under an Ar atmosphere having 10 ppm or less of oxygen. Results showed that the oxygen concentration was increased to 820 wt. ppm from 450 wt. ppm. A sintered compact was produced under similar conditions as in Example 1 except that this CuTeZr powder was used as a raw material powder. An Al—Te—Cu—Zr alloy sintered compact with a purity of 3N or more, an oxygen concentration of 3600 wt. ppm, a relative density of 95% and a mean grain size of 8 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was increased as large as 309.

Comparative Example 4

A sintered compact was produced under similar conditions as in Example 1 except that the composition ratio of Al, Te, Cu and Zr was changed as shown in Table 1. An Al—Te—Cu—Zr alloy sintered compact with a purity of 3N or more, an oxygen concentration of 3000 wt. ppm, a relative density of 90% and a mean grain size of 8 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was as low as 54. However, the above composition failed to provide satisfactory device properties.

Comparative Example 5

A sintered compact was produced under similar conditions as in Example 1 except that the composition ratio of Al, Te, Cu and Zr was changed as shown in Table 1. An Al—Te—Cu—Zr alloy sintered compact with a purity of 3N or more, an oxygen concentration of 2600 wt. ppm, a relative density of 92% and a mean grain size of 5 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was as low as 35. However, the above composition failed to provide satisfactory device properties.

Comparative Example 6

A sintered compact was produced under similar conditions as in Example 6 except that the CuGaTe powder, the Zr powder and the Al powder as raw material powders had a maximum grain size of 150 µm. An Al—Te—Cu—Zr alloy sintered compact with a purity of 3N or more, an oxygen concentration of 2700 wt. ppm, a relative density of 93% and a mean grain size of 15 µm was obtained in a way as described above. Observation showed that the sintered compact had a structure comprising an Al phase, a CuAl phase, a TeZr phase and a Zr phase. Then, this sintered compact was machined to produce a sputtering target, with which sputtering was performed. Results showed that the number of particles (0.2 µm or more) was increased as large as 134.

TABLE 1

| | Composition of Target | | | | | Process | | Evaluation |
|---|---|---|---|---|---|---|---|---|
| | Al/at % | Te/at % | Cu/at % | Zr/at % | Others/at % | CuTeZr Synthesis Temperature (° C.) top | Target Material | Purity |
| Example 1 | 40 | 35 | 15 | 10 | — | 400° C. | Al + CuTeZr | 3N |
| Example 2 | 40 | 35 | 15 | 10 | — | 500° C. | Al + CuTeZr | 3N |
| Example 3 | 40 | 35 | 15 | 10 | — | 400° C. | Al + CuTe + Zr | 3N |
| Example 4 | 60 | 20 | 5 | 15 | — | 400° C. | Al + CuTeZr | 3N |
| Example 5 | 35 | 40 | 20 | 5 | — | 500° C. | Al + CuTeZr | 3N |
| Example 6 | 40 | 30 | 15 | 10 | Ga/5 | 400° C. | Al + CuTeZrGa | 3N |
| Example 7 | 40 | 30 | 15 | 10 | S/5 | 400° C. | Al + CuTeZrS | 3N |
| Example 8 | 40 | 35 | 15 | 5 | Ti/5 | 400° C. | Al + CuTeZr + Ti | 3N |
| Example 9 | 40 | 30 | 15 | 5 | Ge/5, C/5 | 400° C. | Al + CuTeZrGe + C | 3N |
| Example 10 | 40 | 30 | 15 | 5 | Se/5, Si/5 | 400° C. | Al + CuTeZrSe + Si | 3N |
| Comparative Example 1 | 40 | 35 | 15 | 10 | — | 370° C. | Al + Cu + Te + Zr | 3N |
| Comparative Example 2 | 40 | 35 | 15 | 10 | — | 400° C. | Al + CuTeZr | 3N |
| Comparative Example 3 | 40 | 35 | 15 | 10 | — | 400° C. | Al + CuTeZr | 3N |
| Comparative Example 4 | 65 | 10 | 5 | 20 | — | 400° C. | Al + CuTeZr | 3N |
| Comparative Example 5 | 30 | 45 | 22 | 3 | — | 400° C. | Al + CuTeZr | 3N |
| Comparative Example 6 | 40 | 30 | 15 | 10 | Ga/5 | 400° C. | Al + CuTeZrGa | 3N |

TABLE 1-continued

|  | Evaluation | | | | Effect |
|---|---|---|---|---|---|
|  | Relative Density (%) | Oxygen Concentration/ppm | Phase | Mean Grain Size (μm) | Number of Particles (≥0.2 um) |
| Example 1 | 90 | 3000 | Al, CuAl, TeZr, Zr | 8 | 20 |
| Example 2 | 93 | 2900 | Al, CuAl, TeZr, Zr | 9 | 18 |
| Example 3 | 94 | 1900 | Al, CuAl, TeZr, Zr | 7 | 25 |
| Example 4 | 90 | 2700 | Al, CuAl, TeZr, Zr | 8 | 20 |
| Example 5 | 93 | 2400 | Al, CuAl, TeZr, Zr | 9 | 18 |
| Example 6 | 92 | 2800 | Al, CuAl, CuGa, TeZr, Zr | 6 | 39 |
| Example 7 | 90 | 2800 | Al, CuAl, CuS, TeZr, Zr | 5 | 21 |
| Example 8 | 95 | 2600 | Al, CuAl, TeZr, Ti, Zr | 8 | 27 |
| Example 9 | 91 | 2700 | Al, C, CuAl, GeTe, TeZr, Zr | 9 | 16 |
| Example 10 | 91 | 2900 | Al, CuAl, Si, SeTeZr, Zr | 7 | 33 |
| Comparative Example 1 | 95 | 2600 | Al, Cu, CuTe, CuTeZr, TeZr, Zr | 7 | 468 |
| Comparative Example 2 | 83 | 2500 | Al, CuAl, TeZr, Zr | 9 | 221 |
| Comparative Example 3 | 95 | 3600 | Al, CuAl, TeZr, Zr | 8 | 309 |
| Comparative Example 4 | 90 | 3000 | Al, CuAl, TeZr, Zr | 8 | 54 (Poor propterties) |
| Comparative Example 5 | 92 | 2600 | Al, CuAl, TeZr, Zr | 5 | 35 (Poor propterties) |
| Comparative Example 6 | 93 | 2700 | Al, CuAl, CuGa, TeZr, Zr | 15 | 134 |

Advantageously, the sputtering target of Al—Te—Cu—Zr based alloy sintered compact according to the present invention has a small number of constituent phases in the structure thereof, and thus a uniform deposition rate can be obtained. The target also has a fine crystal grain size and a reduced oxygen content, and thus the development of particles and nodules due to these can be reduced. Therefore, the present invention is useful for stably supplying a thin film comprising an Al—Te based alloy which is a high-quality variable resistance recording material.

The invention claimed is:

1. An Al—Te—Cu—Zr alloy sputtering target, comprising 20 at % to 40 at % of Te, 5 at % to 20 at % of Cu, 5 at % to 15 at % of Zr and the remainder of Al, wherein a Te phase, a Cu phase and a CuTe phase are not present in a structure of the target.

2. The Al—Te—Cu—Zr alloy sputtering target according to claim 1, wherein an Al phase, a CuAl phase, a TeZr phase and a Zr phase are present in the structure of the target.

3. The Al—Te—Cu—Zr alloy sputtering target according to claim 1, having a mean grain size of 10 μm or less.

4. The Al—Te—Cu—Zr alloy sputtering target according to claim 1, having a purity of 3N or more and an oxygen content of 3000 wt. ppm or less.

5. The Al—Te—Cu—Zr alloy sputtering target according to claim 1, comprising one or more elements selected from Si, C, Ti, Hf, V, Nb, Ta, lanthanoid elements, Ge, Zn, Co, Ni, Fe, Mg, Ga, S and Se.

6. The Al—Te—Cu—Zr alloy sputtering target according to claim 1, having a relative density of 90% or more.

7. A method of manufacturing an Al—Te—Cu—Zr alloy sputtering target comprising 20 at % to 40 at % of Te, 5 at % to 20 at % of Cu, 5 at % to 15 at % of Zr and the remainder of Al, wherein a Te phase, a Cu phase and a CuTe phase are not present in a structure of the target, the method comprising the steps of: dissolving a Cu raw material and a Te raw material to produce a CuTe alloy ingot; pulverizing the CuTe alloy ingot; then hot-pressing the pulverized CuTe powder and a Zr raw material powder to produce a CuTeZr alloy; then pulverizing the CuTeZr alloy; hot-pressing the pulverized CuTeZr powder and an Al raw material powder to produce a CuTeZrAl alloy.

8. The method of manufacturing an Al—Te—Cu—Zr alloy sputtering target according to claim 7, wherein the pulverized CuTe powder and the Zr raw material powder are hot-pressed at a temperature of 300° C. to 400° C. to produce the CuTeZr alloy.

9. The method of manufacturing an Al—Te—Cu—Zr alloy sputtering target according to claim 7, wherein the pulverized CuTe powder and the Zr raw material powder are hot-pressed at a temperature of 400° C. to 600° C. to produce the CuTeZr alloy.

10. The method of manufacturing an Al—Te—Cu—Zr alloy sputtering target according to claim 7, wherein during the step of pulverizing the CuTeZr alloy, the alloy is pulverized under an inert atmosphere or under vacuum.

11. A method of manufacturing an Al—Te—Cu—Zr alloy sputtering target comprising 20 at % to 40 at % of Te, 5 at % to 20 at % of Cu, 5 at % to 15 at % of Zr and the remainder of Al, wherein a Te phase, a Cu phase and a CuTe phase are not present in a structure of the target, the method comprising the steps of: dissolving a Cu raw material and a Te raw material to produce a CuTe alloy ingot; pulverizing the CuTe alloy ingot; then hot-pressing the pulverized CuTe powder, a Zr raw material powder and an Al raw material powder to produce the CuTeZrAl alloy.

12. The method of manufacturing an Al—Te—Cu—Zr alloy sputtering target according to claim 11, wherein the pulverized CuTe powder, the Zr raw material powder and the Al raw material powder are hot-pressed at a temperature of 300° C. to 600° C. to produce the CuTeZrAl alloy.

13. The method of manufacturing an Al—Te—Cu—Zr alloy sputtering target according to claim 11, wherein the pulverized CuTe powder has a mean grain size of 0.1 to 10 μm, the Zr raw material powder has a mean grain size of 0.1 to 10 μm, and the Al raw material powder has a mean grain size of 0.1 to 10 μm.

14. The method of manufacturing an Al—Te—Cu—Zr alloy sputtering target according to claim 11, wherein the pulverized CuTe powder is subjected to hydrogen reduction.

15. The method of manufacturing an Al—Te—Cu—Zr alloy sputtering target according to claim 11, wherein during the step of pulverizing the CuTe alloy, the alloy is pulverized under an inert atmosphere or under vacuum.

16. The method of manufacturing an Al—Te—Cu—Zr alloy sputtering target according to claim 7, wherein the pulverized CuTe powder has a mean grain size of 0.1 to 10 μm, the Zr raw material powder has a mean grain size of 0.1 to 10 μm, and the Al raw material powder has a mean grain size of 0.1 to 10 μm.

17. The method of manufacturing an Al—Te—Cu—Zr alloy sputtering target according to claim 7, wherein the pulverized CuTe powder is subjected to hydrogen reduction.

18. The method of manufacturing an Al—Te—Cu—Zr alloy sputtering target according to claim 7, wherein during the step of pulverizing the CuTe alloy, the alloy is pulverized under an inert atmosphere or under vacuum.

* * * * *